US007088200B2

(12) United States Patent
Bartley et al.

(10) Patent No.: US 7,088,200 B2
(45) Date of Patent: Aug. 8, 2006

(54) METHOD AND STRUCTURE TO CONTROL COMMON MODE IMPEDANCE IN FAN-OUT REGIONS

(75) Inventors: Gerald Keith Bartley, Rochester, MN (US); Darryl John Becker, Rochester, MN (US); Paul Eric Dahlen, Rochester, MN (US); Philip Raymond Germann, Oronoco, MN (US); Andrew B. Maki, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 10/970,524

(22) Filed: Oct. 21, 2004

(65) Prior Publication Data

US 2006/0087379 A1 Apr. 27, 2006

(51) Int. Cl.
*H03H 7/38* (2006.01)

(52) U.S. Cl. .............................. 333/34; 333/4; 333/12

(58) Field of Classification Search .................... 333/4, 333/5, 12, 33, 34
See application file for complete search history.

(56) References Cited

U.S. PATENT DOCUMENTS 6,677,831 B1 * 1/2004 Cheng et al. ................. 333/34

* cited by examiner

*Primary Examiner*—Stephen E. Jones
(74) *Attorney, Agent, or Firm*—Joan Pennington

(57) ABSTRACT

A method and structure are provided to control common mode impedance in fan-out regions for printed circuit board applications. A differential pair transmission line includes a narrow signal trace portion in the fan-out region and a wider signal trace portion outside of the fan-out region. A dielectric material separates the differential pair transmission line from a reference power plane. A thickness of the narrow signal trace is increased and a thickness of the dielectric material is correspondingly decreased in the fan-out region.

13 Claims, 7 Drawing Sheets

PRIOR ART

PRIOR ART

500

METHOD AND STRUCTURE TO CONTROL COMMON MODE IMPEDANCE IN FAN-OUT REGIONS

FIELD OF THE INVENTION

The present invention relates generally to the data processing field, and more particularly, relates to a method and structure to control common mode impedance in fan-out regions for printed circuit boards.

DESCRIPTION OF THE RELATED ART

More high-speed interfaces, such as InfiniBand, fiber channel, and future DDR interfaces, are using differential signaling with differential pair transmission lines. As a result, the challenge of wiring a signal channel is becoming more complex, with two conductors to manage and common-mode issues to address.

In a fan-out or module region of printed circuit boards, short, narrow trace portions of a differential pair transmission line typically are used in an attempt to minimize the required number of layers to escape the pin field, but then wider trace portions are used once outside of the pin field in order to minimize attenuation on the differential pair transmission line, for example, as shown in FIGS. 1 and 2.

When differential signals are wired through small-pitched via and/or pin arrays, an impedance discontinuity occurs since the signal geometry of the differential pair transmission line is modified.

Known solutions to minimize impedance discontinuities in the differential pair transmission line focus on two-dimensional geometry changes to maintain differential impedance matching but do not adequately match the common-mode impedance.

FIGS. 1 and 2 show a typical prior art arrangement for differential-mode impedance matching. As shown, a differential pair transmission line extends between ports A and B. At port A, the differential pair transmission line is wider outside the pin field near port B and includes narrower, more closely spaced traces near port B. As shown, the differential impedance between ports A and B is matched; however, the common mode impedance between ports A and B is not matched. The narrower more closely spaced differential pair transmission line portion near port B has a higher common mode impedance than the wider differential pair transmission line portion near port A.

As used in the present specification and claims, the term printed circuit board or PCB means a substrate or multiple layers (multi-layer) of substrates used to electrically attach electrical components and should be understood to generally include circuit cards, printed circuit cards, printed wiring cards, printed wiring boards, and chip carrier packages.

A need exists for an effective method that allows for matching both the common-mode and differential impedance for differential pair transmission lines.

SUMMARY OF THE INVENTION

A principal aspect of the present invention is to provide a method and structure to control common mode impedance in fan-out regions for printed circuit board applications. Other important aspects of the present invention are to provide such method and structure to control common mode impedance in fan-out regions substantially without negative effect and that overcome many of the disadvantages of prior art arrangements.

In brief, a method and structure are provided to control common mode impedance in fan-out regions for printed circuit board applications. A differential pair transmission line includes a narrow signal trace portion in the fan-out region and a wider signal trace portion outside of the fan-out region. A dielectric material separates the differential pair transmission line from a reference power plane. A thickness of the narrow signal trace portion is increased and a thickness of the dielectric material is correspondingly decreased in the fan-out region.

In accordance with features of the invention, a taper of electrically conductive material is formed between the wider signal trace portion and the narrow signal trace portion to progressively increase the trace thickness to the increased thickness of the narrow signal trace. The conductive taper is formed and then attached to the differential pair transmission line, for example, through a plating process.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, three-dimensional (3D) geometry changes in the packaging are implemented to realize differential and common-mode impedance matching for differential pair transmission lines.

In accordance with features of the preferred embodiments, conventional methods of matching differential impedance are provided, such as providing changes in signal trace width and pitch, and common-mode impedance matching is implemented through providing changes in dielectric thickness and signal trace thickness.

The present invention is superior to prior art arrangements since both differential-mode impedance and common-mode impedance matching are maintained. Further, the invention enables the benefit of reducing signal attenuation loss characteristics in the fan-out regions by increasing the signal trace thickness.

Figure 1:
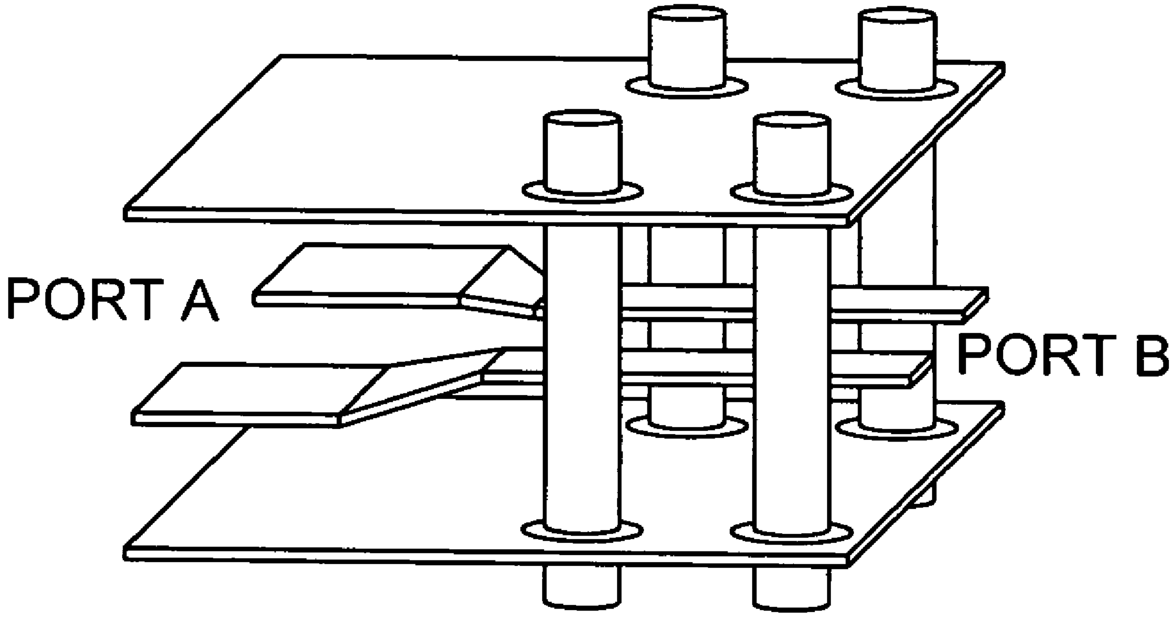
FIGS. 1 and 2 illustrate a prior art differential pair transmission line arrangement for implementing differential-mode impedance matching for fan-out regions.
Figure 2:
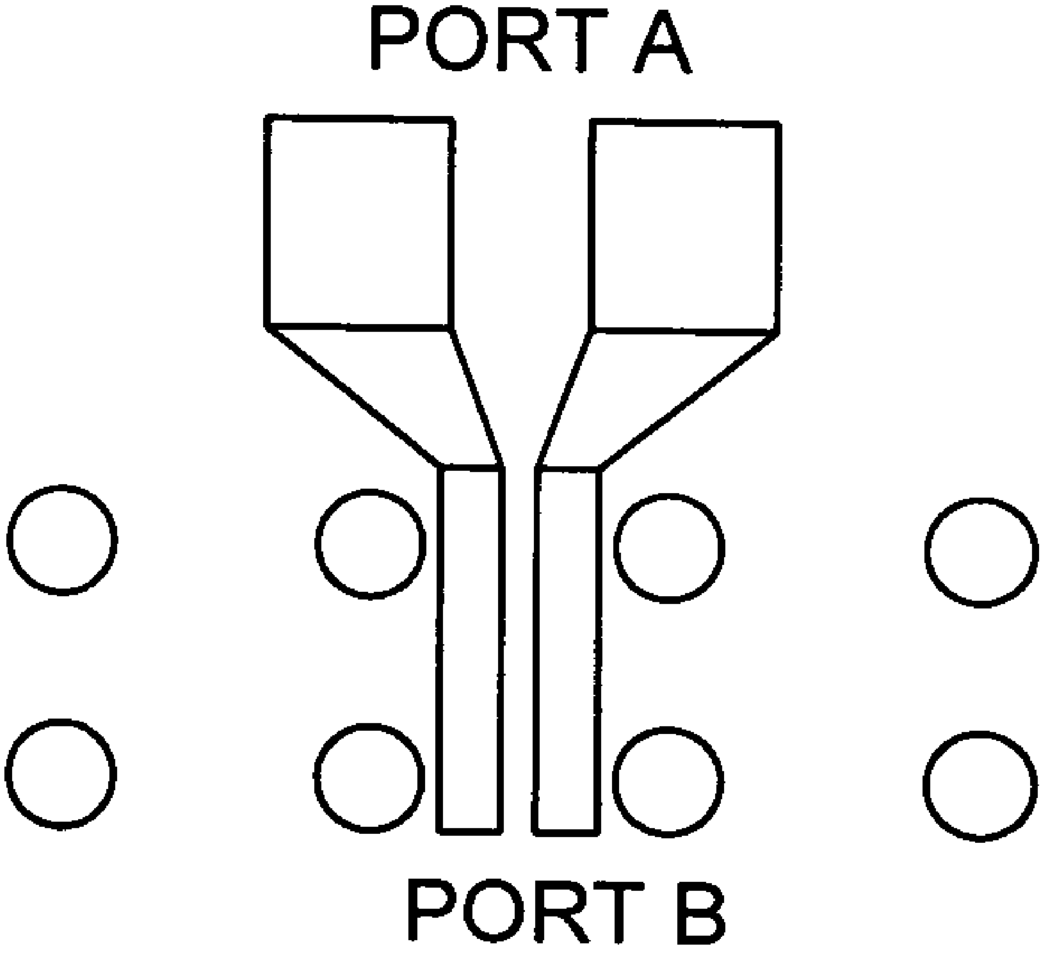
Figure 3:
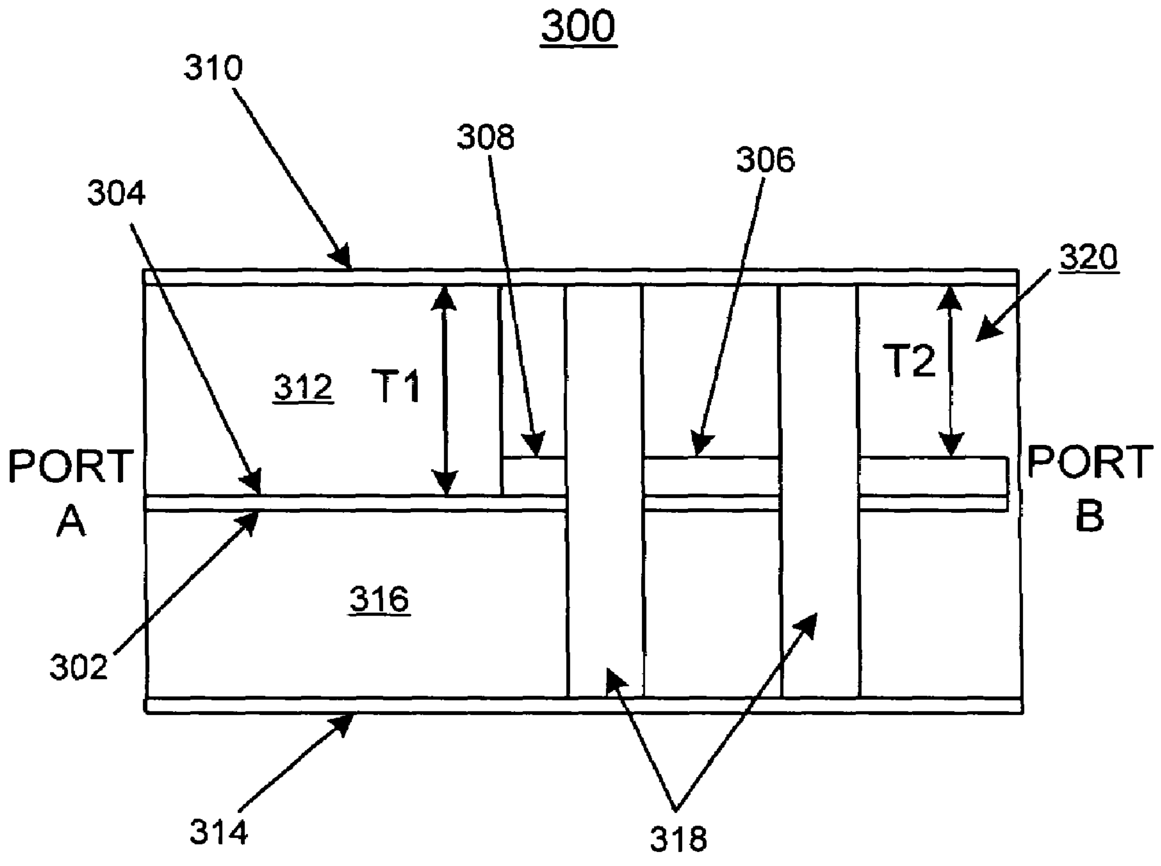
FIG. 3 illustrates an exemplary differential pair transmission line structure for implementing differential-mode and common-mode impedance matching for fan-out regions in accordance with a preferred embodiment.

Having reference now to the drawings, in FIG. 3, there is shown an exemplary differential pair transmission line structure generally designated by the reference character 300 for implementing differential-mode and common-mode impedance matching in accordance with a preferred embodiment. The differential pair transmission line structure 300 includes a pair of conductors or traces generally designated by the reference character 302 extending between ports A and B. As in the prior art arrangement of FIGS. 1 and 2, at port A the differential pair conductors 302 includes a wider portion 304 outside a pin field near port B and includes a relatively short, narrower, more closely spaced trace portion 306 near port B with a transition portion 308 extending between the conductor portions 304 and 306. An upper reference power plane 310 is separated from the differential pair conductors 302 by a dielectric fill material 312. A lower reference power plane 314 is separated from the differential pair conductors 302 by a core material 316 or other dielectric fill material 316. A plurality of vias or pins 318 is located near the narrow trace portions 306. A fan-out region generally designated by the reference character 320 includes the printed circuit board or module packaging area containing the differential pair conductor portions 306, 308.

In accordance with features of the preferred embodiments with properly chosen dimensions of the core material 316, dielectric fill material 312, and conductors 302, the differential mode impedance and common mode impedance are substantially matched between port A and port B.

As shown in FIG. 3, the signal trace conductor portions 306, 308 are made to be thicker than the signal trace portion 304 near port A. The thicker conductor portions 306 near port B are closer to the power plane 310 than the conductor portions 304 near port A. The thicker conductor portions 306 help to lower and substantially match the common mode impedance at port B to the common mode impedance at port A. The thicker conductor portions 306 near port B also help to compensate for otherwise higher attenuation loss at port B as compared to port A. The dielectric fill material 312 has corresponding mating stepped change as conductors 302 including a first thickness T1 near port A and a second smaller thickness T2 near port B. The impedance change between port A and port B is achieved by a stepped change in both the thickness of the dielectric 308 and differential pair conductors 302.

Figure 4:
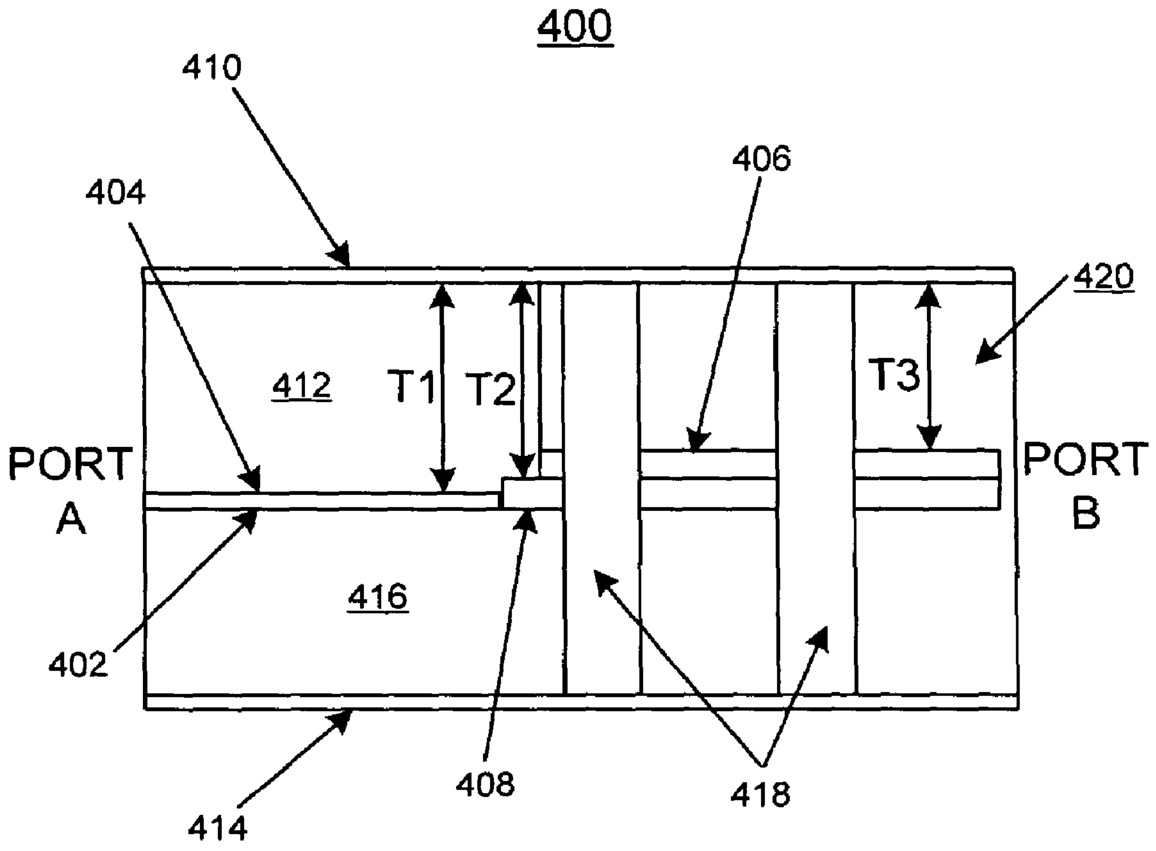
FIG. 4 illustrates another exemplary differential pair transmission line structure for implementing differential-mode and common-mode impedance matching for fan-out regions in accordance with another preferred embodiment.

FIG. 4 illustrates another exemplary differential pair transmission line structure generally designated by the reference character 400 for implementing differential-mode and common-mode impedance matching in accordance with another preferred embodiment. The differential pair transmission line structure 400 includes a pair of conductors or traces generally designated by the reference character 402 extending between ports A and B. As in the prior art arrangement of FIGS. 1 and 2, at port A the differential pair conductors 402 includes a wider portion 404 outside a pin field near port B and includes a relatively short, narrower, more closely spaced trace portion 406 near port B with a transition portion 408 between the differential pair conductor portions 404 and 406. An upper reference power plane 410 is separated from the differential pair conductors 402 by a dielectric fill material 412. A lower reference power plane 414 is separated from the differential pair conductors 402 by a core material 416. A plurality of vias or pins 418 is located near the narrow trace portions 406. A fan-out region generally designated by the reference character 420 includes the printed circuit board or module packaging area containing the differential pair conductor portions 406, 408.

Similarly with properly chosen dimensions of the core 416, dielectric fill 412, and conductors 402, the differential mode impedance and common mode impedance of the differential pair transmission line structure 400 are substantially matched between port A and port B. The impedance change between port A and port B is achieved by a dual stepped change in the thickness of the dielectric 412 and the differential pair conductors 402.

As shown in FIG. 4, the signal trace conductor portion 408 between conductor portions 404 and 406 is increased in thickness with a two stepped change and is made to be thicker near port B than the signal trace portion 404 near port A. The dielectric fill material 412 has a first thickness T1 from port A into the fan-out region 420, a second smaller thickness T2 and a third smaller thickness T3 at the dual stepped transition portions 408. The thicker conductor portion 406 near port B is closer to the power plane 410. The thicker conductor portion 406 near port B helps to lower and substantially match the common mode impedance at port B to the common mode impedance at port A. The thicker conductor portion 406 near port B also helps to compensate for higher attenuation loss at port B as compared to port A.

Both the differential pair transmission line structure 300 of FIG. 3 and the differential pair transmission line structure 400 of FIG. 4 provide improved differential-mode and common-mode impedance continuity. However, the impedance continuity is not optimal at all frequencies for the differential pair transmission line structure 300 of FIG. 3 and the differential pair transmission line structure 400 of FIG. 4.

Figure 5:
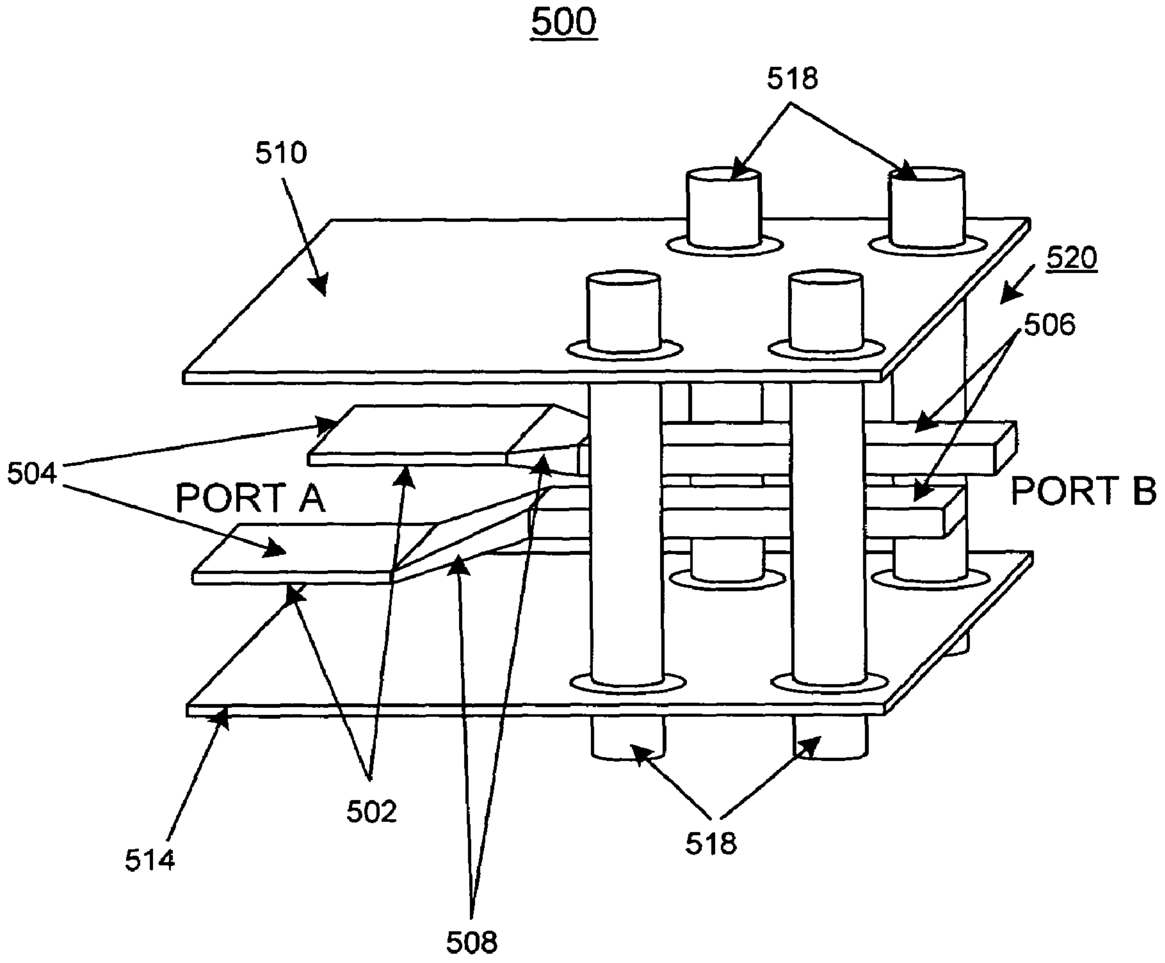
FIGS. 5 and 6 illustrate an exemplary enhanced differential pair transmission line structure for implementing differential-mode and common-mode impedance matching for fan-out regions in accordance with the preferred embodiment.
Figure 6:
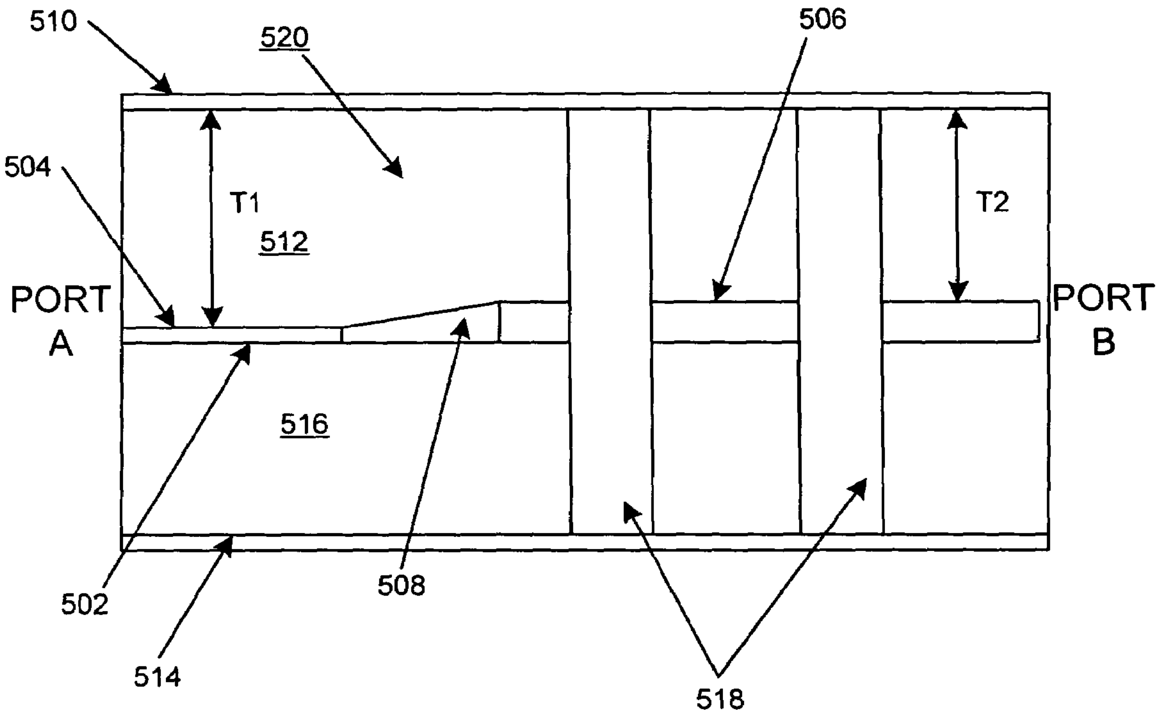

FIGS. 5 and 6 illustrate an exemplary enhanced differential pair transmission line structure generally designated by the reference character 500 for implementing differential-mode and common-mode impedance matching in accordance with the preferred embodiment. The enhanced differential pair transmission line structure 500 includes a pair of conductors or traces generally designated by the reference character 502 extending between ports A and B. As shown, at port A the differential pair conductors 502 includes a wider portion 504 outside a pin field near port B and includes a relatively short, narrower, more closely spaced trace portion 506 near port B with a transition region 508 extending between the conductor portions 504 and 506. An upper reference power plane 510 is separated from the differential pair conductors 502 by a dielectric fill material 512. A lower reference power plane 514 is separated from the differential pair conductors 502 by a core material 516. A plurality of vias or pins 518 is located near the narrow trace portions 506. A fan-out region generally designated by the reference character 520 includes the printed circuit board or module packaging area containing the differential pair conductor portions 506, 508.

FIGS. 5 and 6 show optimal geometry changes for yielding a smoothest impedance transform from port A to port B. With a properly implemented taper defining the transition region 508 between the conductor portions 504 and 506 the impedance discontinuity advantageously is minimized. The taper 508 is a puck of electrically conductive material that advantageously is formed, following circuitization, but prior to the lamination of the layers of the printed circuit board. This taper 508 is formed, for example, by stamping such as in a lead frame, or by screening paste-like materials, foil cutting and plating, embossing, deposition, and the like. This taper 508 can be attached to the card, and connected to the differential pair conductors 502 on the circuitized layer defining differential pair conductor portions 504 and 506 through a plating process, or other process. If necessary, cloth plies which will be laminated between the core and dielectric layers 516, 512 can be stamped or milled out to avoid irregular lamination or bumps in the raw card. Then the card can be laminated in the normal manufacturing process, as shown in FIG. 7.

Figure 7:
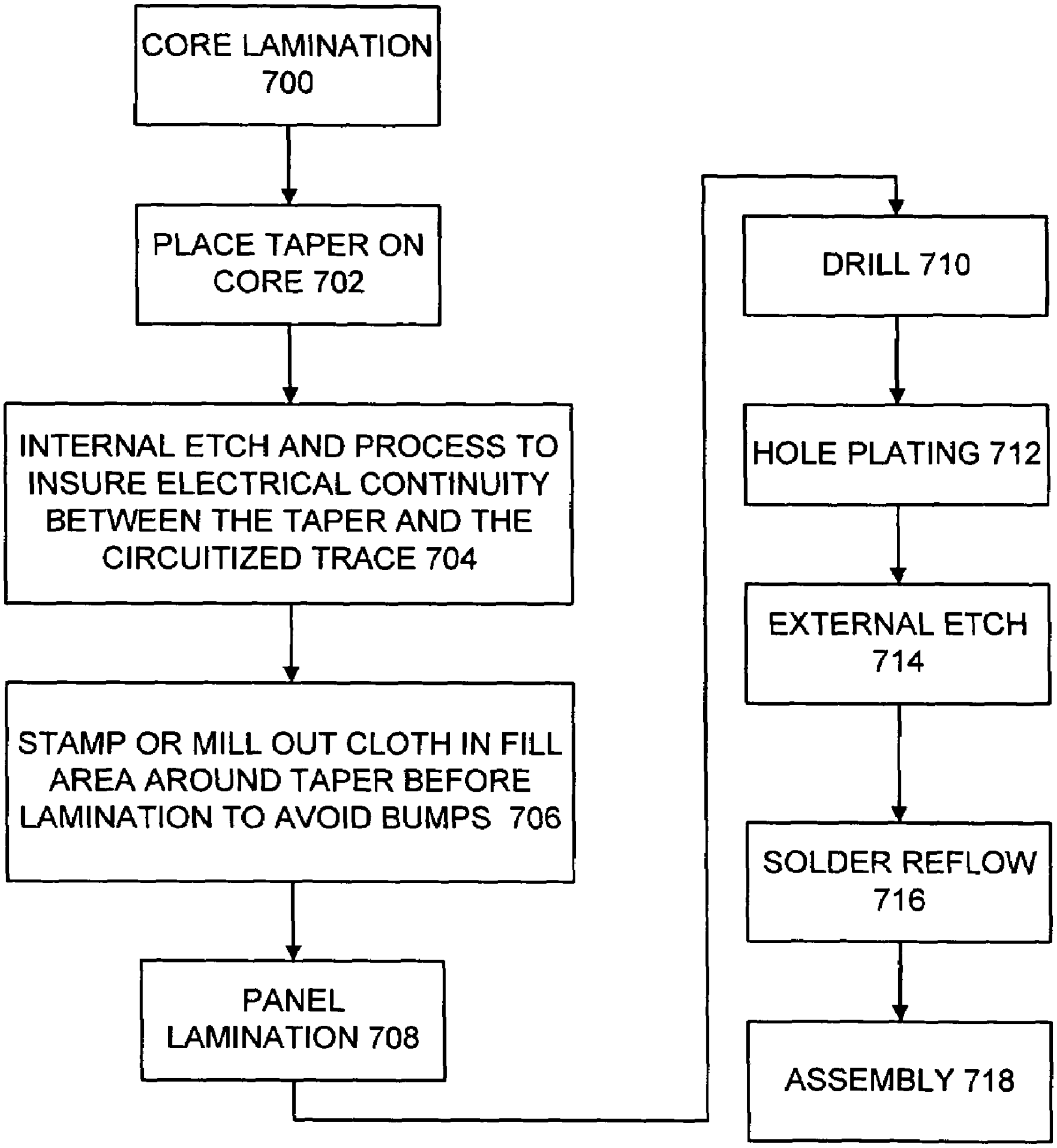
FIG. 7 illustrates exemplary manufacturing processing steps for implementing the enhanced differential pair transmission line structure of FIGS. 5 and 6.

Referring now to FIG. 7, there are shown exemplary manufacturing processing steps for implementing the enhanced differential pair transmission line structure 500 of FIGS. 5 and 6. A core lamination is formed as indicated in a block 700. A process in accordance with the preferred embodiment is provided to place a taper on the core as indicated in a block 702. Next an internal etch and another process in accordance with the preferred embodiment is provided to insure electrical continuity between the taper and the circuitized trace, for example, taper 508 and circuitized trace conductor portions 504 and 506, as indicated in a block 704. Next a cloth carrier to be filled with dielectric or core material optionally is stamped or milled out to avoid irregularities or bumps in the fill area around the taper as indicated in a block 706. Then conventional manufacturing processing steps are performed including panel lamination at block 708, drill at block 710, hole plating at block 712, external etch at block 714, solder reflow at block 716, and assembly at block 718.

While the present invention has been described with reference to the details of the embodiments of the invention shown in the drawing, these details are not intended to limit the scope of the invention as claimed in the appended claims.

What is claimed is:

1. A structure for controlling common mode impedance in fan-out regions for printed circuit board applications comprising:

a differential pair transmission line having a narrow signal trace portion in the fan-out region and a wider signal trace portion outside of the fan-out region;

a reference power plane spaced apart from the differential pair transmission line;

a dielectric material separating the differential pair transmission line from the reference power plane;

said narrow signal trace portion in the fan-out region having an increased thickness relative to said wider signal trace portion; and said dielectric material in the fan-out region having a correspondingly decreased thickness.

2. A structure for controlling common mode impedance in fan-out regions as recited in claim 1 wherein a taper of electrically conductive material is formed between said wider signal trace portion and said narrow signal trace portion to increase the trace thickness of said narrow signal trace.

3. A structure for controlling common mode impedance in fan-out regions as recited in claim 1 wherein said taper of electrically conductive material is formed through a selected one or combination of a plating process, a stamping process, a screening process, a foil cutting process, an embossing process, and a deposition process.

4. A structure for controlling common mode impedance in fan-out regions as recited in claim 1 wherein said increased thickness of said narrow signal trace portion relative to said wider signal trace portion includes a step change in thickness from a first thickness of said wider signal trace portion to said increased thickness of said narrow signal trace portion.

5. A structure for controlling common mode impedance in fan-out regions as recited in claim 1 wherein said increased thickness of said narrow signal trace portion relative to said wider signal trace portion includes multiple thickness change steps from a first thickness of said wider signal trace portion to said increased thickness of said narrow signal trace portion.

6. A method for controlling common mode impedance in fan-out regions for printed circuit board applications including a differential pair transmission line having a narrow signal trace portion in the fan-out region and a wider signal trace portion outside of the fan-out region and a dielectric material separating the differential pair transmission line from a reference power plane comprising the steps of:

providing an increased trace thickness for the narrow signal trace in the fan-out region relative to the wider signal trace portion; and correspondingly decreasing a thickness of the dielectric material in the fan-out region.

7. A method for controlling common mode impedance in fan-out regions for printed circuit board applications as recited in claim 6 wherein the step of providing an increased trace thickness for the narrow signal trace in the fan-out region includes the step of forming an electrically conductive taper between the wider signal trace portion and the narrow signal trace portion, said taper progressively narrowed toward a first thickness of said wider signal trace portion from said increased trace thickness.

8. A method for controlling common mode impedance in fan-out regions for printed circuit board applications as recited in claim 6 wherein the step of providing an increased trace thickness for the narrow signal trace in the fan-out region includes the step of providing a step change in trace thickness between the narrow signal trace in the fan-out region and the wider signal trace portion.

9. A method for controlling common mode impedance in fan-out regions for printed circuit board applications as recited in claim 6 wherein the step of providing an increased trace thickness for the narrow signal trace in the fan-out region includes the step of providing multiple thickness change steps from a first thickness of said wider signal trace portion to said increased thickness of said narrow signal trace portion.

10. A method for controlling common mode impedance in fan-out regions for printed circuit board applications as recited in claim 6 wherein the step of providing an increased trace thickness for the narrow signal trace in the fan-out region includes the step of forming an electrically conductive tapered member and connecting said tapered member between said wider signal trace portion and said narrow signal trace portion.

11. A method for controlling common mode impedance in fan-out regions for printed circuit board applications as recited in claim 10 wherein a plating process is provided for connecting said tapered member between said wider signal trace portion and said narrow signal trace portion.

12. A method for controlling common mode impedance in fan-out regions for printed circuit board applications as recited in claim 10 includes the step of stamping a cloth carrier for the dielectric material around said tapered member.

13. A method for controlling common mode impedance in fan-out regions for printed circuit board applications as recited in claim 10 includes the step of testing for electrical continuity between said tapered member and each of said wider signal trace portion and said narrow signal trace portion.

* * * * *